US011112433B2

(12) United States Patent
Worones et al.

(10) Patent No.: US 11,112,433 B2
(45) Date of Patent: Sep. 7, 2021

(54) NON-CONTACT ELECTRICAL PARAMETER MEASUREMENT DEVICE WITH CLAMP JAW ASSEMBLY

(71) Applicant: Fluke Corporation, Everett, WA (US)

(72) Inventors: Jeffrey E. Worones, Seattle, WA (US); Ginger M. Woo, Shoreline, WA (US); Chris Corrigan, Blacksburg, VA (US); Yinzi Liang, Lynnwood, WA (US)

(73) Assignee: FLUKE CORPORATION, Everett, WA (US)

( * ) Notice: Subject to any disclaimer, the term of this patent is extended or adjusted under 35 U.S.C. 154(b) by 50 days.

(21) Appl. No.: 16/536,118

(22) Filed: Aug. 8, 2019

(65) Prior Publication Data

US 2021/0041483 A1 Feb. 11, 2021

(51) Int. Cl.
*G01R 15/20* (2006.01)
*G01R 15/14* (2006.01)
*G01R 15/18* (2006.01)

(52) U.S. Cl.
CPC .......... *G01R 15/14* (2013.01); *G01R 15/181* (2013.01); *G01R 15/202* (2013.01); *G01R 15/205* (2013.01)

(58) Field of Classification Search
CPC .... G01R 15/14; G01R 15/181; G01R 15/202; G01R 15/205; G01R 15/186; G01R 15/22; G01R 15/045; G01R 31/00
See application file for complete search history.

(56) References Cited

U.S. PATENT DOCUMENTS

| | | | | |
|---|---|---|---|---|
| 5,003,249 A * | 3/1991 | Bird | ........... | G01R 31/54 324/122 |
| 5,610,512 A * | 3/1997 | Selcuk | ........... | G01R 1/04 324/127 |
| 6,541,955 B2 * | 4/2003 | Landre | ........... | G01R 1/22 324/117 H |
| 7,944,197 B2 * | 5/2011 | Shah | ........... | G01R 1/22 324/115 |
| 8,120,350 B2 * | 2/2012 | Shah | ........... | G01R 1/22 324/126 |

(Continued)

OTHER PUBLICATIONS

European Search Report, dated Jan. 20, 2021, for European Application No. 20189327.8-1010, 8 pages.

*Primary Examiner* — Patrick Assouad
*Assistant Examiner* — Demetrius R Pretlow
(74) *Attorney, Agent, or Firm* — Seed IP Law Group LLP

(57) ABSTRACT

Systems and methods are provided for measuring electrical parameters in a conductor without requiring a galvanic connection. A device includes a body and a clamp jaw assembly movable between an open position that allows a conductor to be moved into a measurement area, and a closed position that secures the conductor within the measurement area. The clamp jaw assembly includes sensors positioned inside a clamp jaw of the clamp jaw assembly. A user may apply a force to an actuator to move the clamp jaw assembly from the closed position into the open position so that the conductor may be positioned and secured in the measurement area. The clamp jaw assembly includes a visual indicator to guide the user to position the conductor within an optimal region in the measurement area. The clamp jaw assembly is sized and dimensioned to automatically position the conductor within the optimal region during measurements.

20 Claims, 5 Drawing Sheets

(56) References Cited

U.S. PATENT DOCUMENTS

| | | | |
|---|---|---|---|
| 8,330,449 B2 | 12/2012 | Greenberg | |
| 9,696,362 B2* | 7/2017 | Nguyen | G01R 1/04 |
| 10,119,998 B2 | 11/2018 | Ringsrud et al. | |
| 10,139,435 B2 | 11/2018 | Steuer et al. | |
| 10,281,503 B2 | 5/2019 | Steuer et al. | |
| 10,352,967 B2 | 7/2019 | Steuer et al. | |
| 2013/0076343 A1* | 3/2013 | Carpenter | G01R 19/00 |
| | | | 324/202 |
| 2013/0147464 A1* | 6/2013 | Tan | G01R 1/22 |
| | | | 324/126 |
| 2013/0208761 A1* | 8/2013 | Mavrides | G01J 5/0265 |
| | | | 374/121 |
| 2014/0062459 A1* | 3/2014 | El-Essawy | G01R 15/205 |
| | | | 324/117 R |
| 2014/0132248 A1* | 5/2014 | Mitsuya | G01R 15/207 |
| | | | 324/117 R |
| 2014/0266287 A1* | 9/2014 | Reeder, III | G01R 1/0408 |
| | | | 324/759.01 |
| 2014/0354302 A1* | 12/2014 | Lu | G01R 27/2605 |
| | | | 324/658 |
| 2015/0145500 A1* | 5/2015 | Oshima | G01R 21/006 |
| | | | 324/76.77 |
| 2016/0047846 A1* | 2/2016 | Sharma | G01R 15/205 |
| | | | 324/251 |
| 2016/0091533 A1* | 3/2016 | Soleillant | G01R 15/18 |
| | | | 324/127 |
| 2016/0223588 A1* | 8/2016 | Fox | G01S 17/08 |
| 2017/0234909 A1* | 8/2017 | Tierney | G01R 15/186 |
| | | | 324/127 |
| 2018/0038893 A1* | 2/2018 | Tierney | G01R 15/12 |
| 2018/0136257 A1* | 5/2018 | Steuer | G01R 15/14 |
| 2018/0136260 A1* | 5/2018 | Rodriguez | G01R 19/00 |
| 2018/0224482 A1* | 8/2018 | Chien | G01R 15/186 |
| 2020/0011901 A1* | 1/2020 | Lin | G01R 15/186 |

* cited by examiner

NON-CONTACT ELECTRICAL PARAMETER MEASUREMENT DEVICE WITH CLAMP JAW ASSEMBLY

BACKGROUND

Technical Field

The present disclosure generally relates to electrical parameter measurement devices, and more particularly, to clamp jaw assemblies for electrical parameter measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

A clamp meter-type electrical parameter measurement device is a current measurement device capable of measuring a current flow in an electric wire without interrupting the current flow. The electrical parameter measurement device generally has two clamp jaws movable in relation to each other. During measurement, distal ends of the two clamp jaws meet to substantially engage with each other.

With conventional devices which measure voltage or current, it may be necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching probes to stripped wires or terminals can be relatively dangerous due to the risks of shock or electrocution. A "non-contact" measurement device may be used to detect the presence of voltage or current without requiring galvanic contact with the circuit. Since the measurement devices may have a relatively large measurement area compared to the diameter of a wire under test, users may have a difficult time knowing where inside the measurement area is the best location for the conductor to provide the best measurement accuracy.

BRIEF SUMMARY

An electrical parameter measurement device may be summarized as including: a body; and a clamp jaw assembly coupled to the body, the clamp jaw assembly comprising: a first clamp jaw comprising a proximal end coupled to the body and a distal end opposite the proximal end; a second clamp jaw comprising a proximal end coupled to the body and a distal end opposite the proximal end, the first clamp jaw and the second clamp jaw being movable in relation to each other between a closed position and an open position wherein, in the closed position, the respective distal ends of the first and second clamp jaws meet to define an enclosed measurement area between the first and second clamp jaws, and in the open position the respective distal ends of the first and second clamp jaws are separate from each other to define a gap that allows a conductor under test to pass therethrough into or out of the measurement area; at least one sensor positioned within an interior of the first clamp jaw or the second clamp jaw; and a visual indicator disposed proximate the at least one sensor on a surface of the first clamp jaw or the second clamp jaw, the visual indicator operative to guide an operator of the electrical parameter measurement device to position the conductor under test proximate the visual indicator to provide accurate electrical parameter measurements.

The first clamp jaw may be pivotally mounted to the body for pivoting movement relative to the second clamp jaw which is fixedly mounted to the body. The visual indicator may include a color-based visual indicator. The visual indicator may include a color of the surface of the first clamp jaw or the second clamp jaw that is different than a color of a portion of the first clamp jaw or the second clamp jaw that surrounds the visual indicator. The visual indicator may include one or more of text-based indicator, a graphic-based indicator, or a physical shape indicator. The at least one sensor may include at least one voltage sensor or at least one current sensor. The at least one sensor may include a plurality of voltage sensors, at least one voltage sensor of the plurality of voltage sensors positioned inside the first clamp jaw proximate the distal end thereof, and at least one voltage sensor of the plurality of voltage sensors positioned inside the second clamp jaw proximate the distal end thereof. The visual indicator may be disposed on the respective surfaces of each of the distal ends of the first and second clamp jaws proximate the plurality of sensors. The distal end of one of the first clamp jaw and the second clamp jaw may have a hook shaped portion that receives the conductor under test when the electrical parameter measurement device hangs from the conductor.

The electrical parameter measurement device may further include an actuator operatively coupled to at least one of the first clamp jaw and the second clamp jaw, in operation, responsive to actuation by a user the actuator moves the clamp jaw assembly from the closed position to the open position.

The actuator may bias the clamp jaw assembly in the closed position. The at least one sensor may include at least one of a non-contact voltage sensor, a Hall Effect sensor, a fluxgate sensor, a Rogowski coil, an anisotropic magnetoresistance (AMR) sensor, or a giant magnetoresistance (GMR) sensor.

The electrical parameter measurement device may further include control circuitry communicatively coupled to the at least one sensor, in operation, the control circuitry: receives sensor data indicative of signals detected by the at least one sensor; and processes the received sensor data to determine at least one electrical parameter of the conductor under test.

The electrical parameter measurement device may further include a wireless communications subsystem operatively coupled to the control circuitry, in operation, the wireless communication subsystem wirelessly transmits the determined electrical parameter to an external system.

The electrical parameter measurement device may further include a display that, in operation, visually presents the determined electrical parameter to a user of the electrical parameter measurement device.

A clamp jaw assembly for measuring an electrical parameter in an insulated conductor may be summarized as including: a first clamp jaw comprising a proximal end and a distal end opposite the proximal end; a second clamp jaw comprising a proximal end and a distal end opposite the proximal end, the first clamp jaw and the second clamp jaw being movable in relation to each other between a closed position and an open position wherein, in the closed position, the respective distal ends of the first and second clamp jaws meet to define an enclosed measurement area between the first and second clamp jaws, and in the open position the respective distal ends of the first and second clamp jaws are separate from each other to define a gap that allows a conductor under test to pass therethrough into or out of the measurement area; at least one sensor positioned within an interior of the first clamp jaw or the second clamp jaw; and a visual indicator disposed proximate the at least one sensor on a surface of the first clamp jaw or the second clamp jaw, the visual indicator operative to guide an operator to position the conductor under test proximate the visual indicator to provide accurate electrical parameter measurements.

The visual indicator may include a color-based visual indicator. The visual indicator may include one or more of text-based indicator, a graphic-based indicator, or a physical shape indicator. The at least one sensor may include at least one voltage sensor or at least one current sensor.

A device for measuring an electrical parameter in an insulated conductor may be summarized as including: a body; a clamp jaw assembly coupled to the body, the clamp jaw assembly comprising: a first clamp jaw comprising a proximal end coupled to the body and a distal end opposite the proximal end; a second clamp jaw comprising a proximal end coupled to the body and a distal end opposite the proximal end, the first clamp jaw and the second clamp jaw being movable in relation to each other between a closed position and an open position wherein, in the closed position, the respective distal ends of the first and second clamp jaws meet to define an enclosed measurement area between the first and second clamp jaws, and in the open position the respective distal ends of the first and second clamp jaws are separate from each other to define a gap that allows a conductor under test to pass therethrough into or out of the measurement area; a first sensor positioned within an interior of the first clamp jaw proximate the distal end of the first clamp jaw; a second sensor positioned within an interior of the second clamp jaw proximate the distal end of the second clamp jaw; and a visual indicator disposed proximate each of the first and second sensors, the visual indicator operative to guide an operator of the electrical parameter measurement device to position the conductor under test proximate the visual indicator to provide accurate electrical parameter measurements; a display; and control circuitry communicatively coupleable to the first and second sensors and the display, in operation, the control circuitry: receives sensor data indicative of signals detected by the first and second sensors; processes the received sensor data to determine at least one electrical parameter of the insulated conductor; and causes the display to present the determined at least one electrical parameter to a user.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
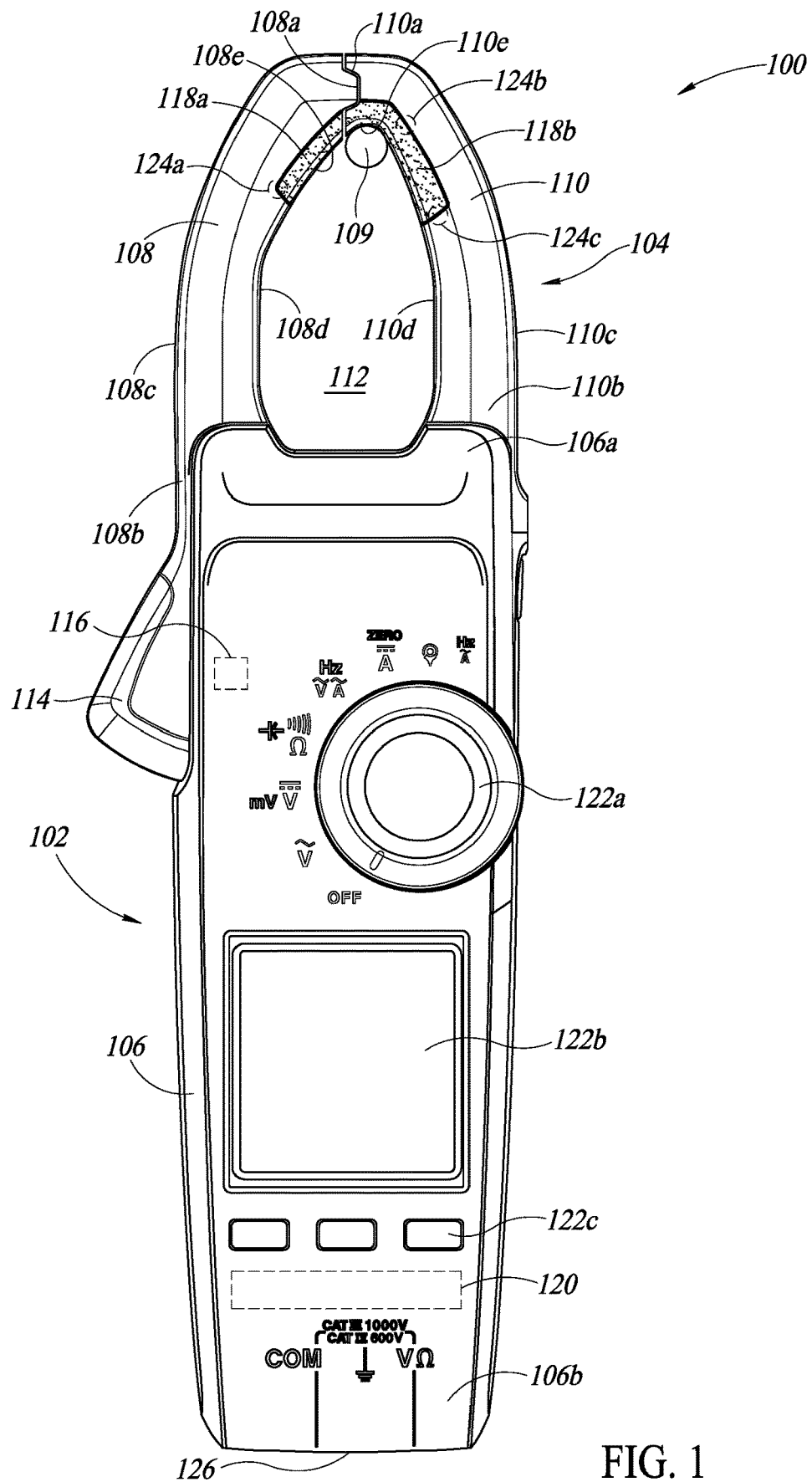
FIG. 1 is a pictorial diagram of an electrical parameter measurement device that includes a clamp jaw assembly that includes one or more sensors, wherein the jaw assembly is positioned in a closed position to surround an insulated conductor under test, according to one non-limiting illustrated implementation.

One or more implementations of the present disclosure are directed to systems and methods for measuring electrical parameters (e.g., voltage, current, power) in an insulated or blank uninsulated conductor (e.g., insulated wire) without requiring a galvanic connection between the conductor and an electrical parameter sensor probe. Generally, a non-galvanic contact (or "non-contact") electrical parameter measurement device is provided which measures one or more electrical parameters in an insulated conductor. Such systems which do not require a galvanic connection are referred to herein as "non-contact." As used herein, "electrically coupled" includes both direct and indirect electrical coupling unless stated otherwise.

In at least some implementations, a non-contact, electrical parameter measurement device is provided that is operative to accurately measure at least one of current and voltage in an insulated conductor under test. The electrical parameter measurement device may include a clamp jaw assembly (or "jaw assembly") used to measure electrical parameters in conductors that have various shapes and sizes. In at least some implementations, the electrical parameter measurement device includes a body and a clamp jaw assembly coupled to the body that is movable between an open position that allows a conductor under test to be moved into and out of a measurement area, and a closed position that secures the insulated conductor within the measurement area so that one or more measurements may be obtained. The jaw assembly may include one or more non-contact sensors coupled thereto, such as disposed within an inside space of one or both jaws of the clamp jaw assembly. The one or more sensors may include voltage sensors, current sensors, both, or other types of sensors. In operation, a user may apply a force to an actuator (e.g., trigger, slide switch) which moves one or both jaws of the jaw assembly from a normally closed position into an open position. The user may then position the insulated conductor under test within a measurement area of the jaw assembly, and may then release the force, or apply a different force (e.g., in the opposite direction) to the actuator, which causes the one or more jaws to return to the closed position, thereby securing the conductor within the measurement area.

The measurement area within the jaw assembly may be relatively large compared to the diameter of the wire under test, which allows the jaw assembly to accommodate conductors of various sizes. Further, the one or more sensors, which are disposed within one or both of the jaws of the jaw assembly and are therefore not visible, may be positioned such that there are particular regions within the measurement area that provide more accurate measurements for the conductor under test compared to other regions. Thus, it may be desirable for the user to position the conductor within a particular region of the measurement area to obtain the best measurements.

Advantageously, in at least some implementations one or both of the jaws of the jaw assembly may include a visual indicator proximate one or more of the sensors. The visual indicator guides the user to place the conductor under test adjacent the visual indicator so that the conductor is adjacent the sensor(s) in an optimal region, thereby improving measurement accuracy. The visual indicator may include a color-based indicator, a text-based indicator, a graphic-based indicator, a physical shape (e.g., notch, bump, or other indicator), or any other type of indicator that provides a visual guide to the user regarding where to position the conductor under test to obtain the most accurate measurement results.

Further, in at least some implementations, the jaw assembly and sensors may be shaped and dimensioned to automatically direct the conductor under test into a region of the measurement area that provides the highest accuracy. In particular, for a vertical conductor, the jaw assembly may have a skewed shape that allows the user to pull the electrical parameter measurement device toward them when the conductor is in the measurement area, and the jaw assembly automatically guides the conductor to the optimal region of the measurement area. For a horizontal conductor, the weight of the electrical parameter measurement device may cause the electrical parameter measurement device to naturally "hang" on the conductor in the measurement area and, when so positioned, the conductor is automatically adjacent the sensor(s) in the optimum region of the measurement area.

Once measurements have been obtained, the user may again cause the jaw assembly to move into the open position so that the insulated conductor can be removed from the measurement area. Particular features of the implementations of the present disclosure are discussed in detail below with reference to the FIGS. 1-5.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 2:
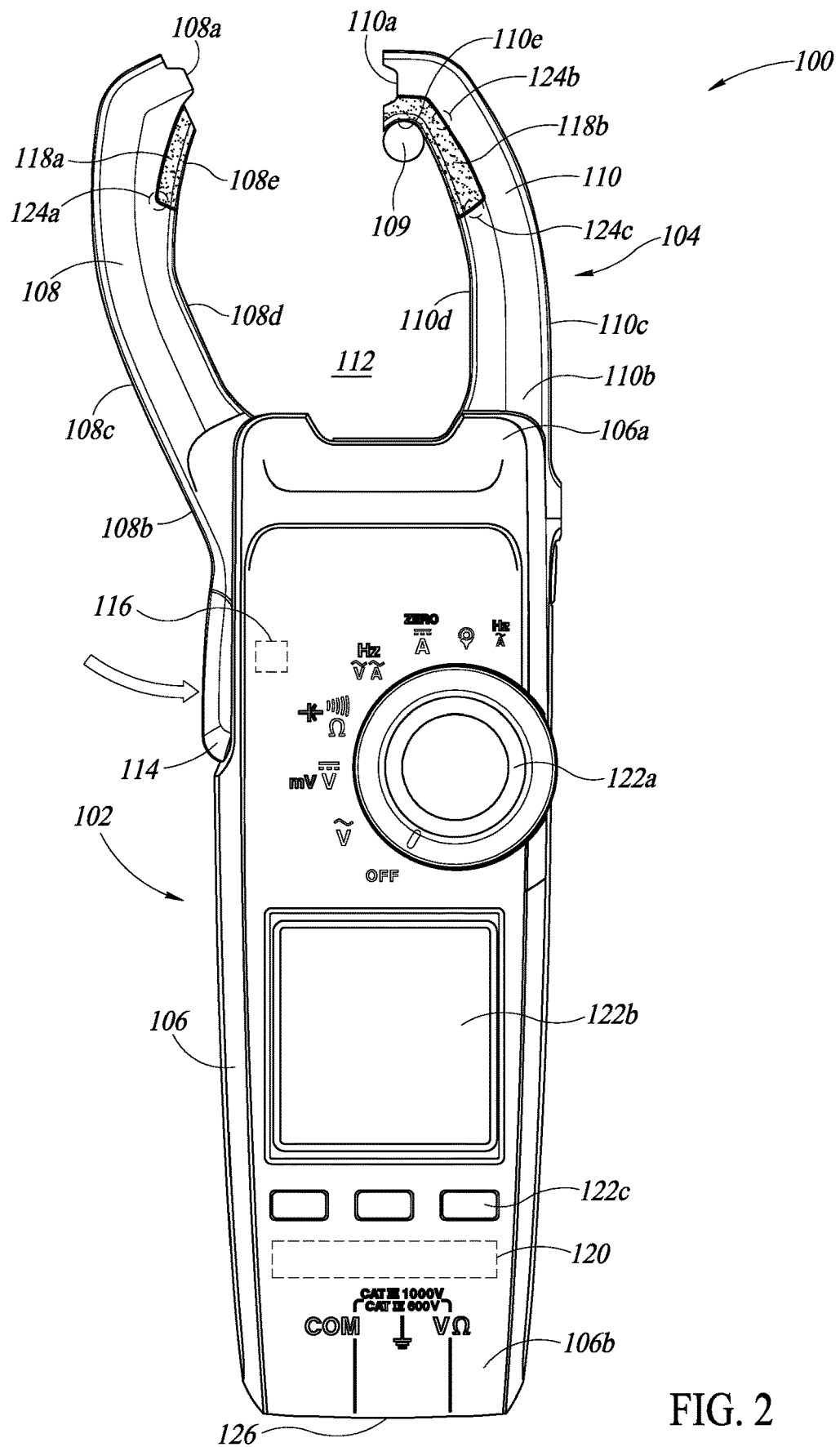
FIG. 2 is a pictorial diagram of the electrical parameter measurement device of FIG. 1, shown with the clamp jaw assembly opened to allow the insulated conductor under test to be inserted into and removed from the clamp jaw assembly, according to one non-limiting illustrated implementation.
Figure 3:
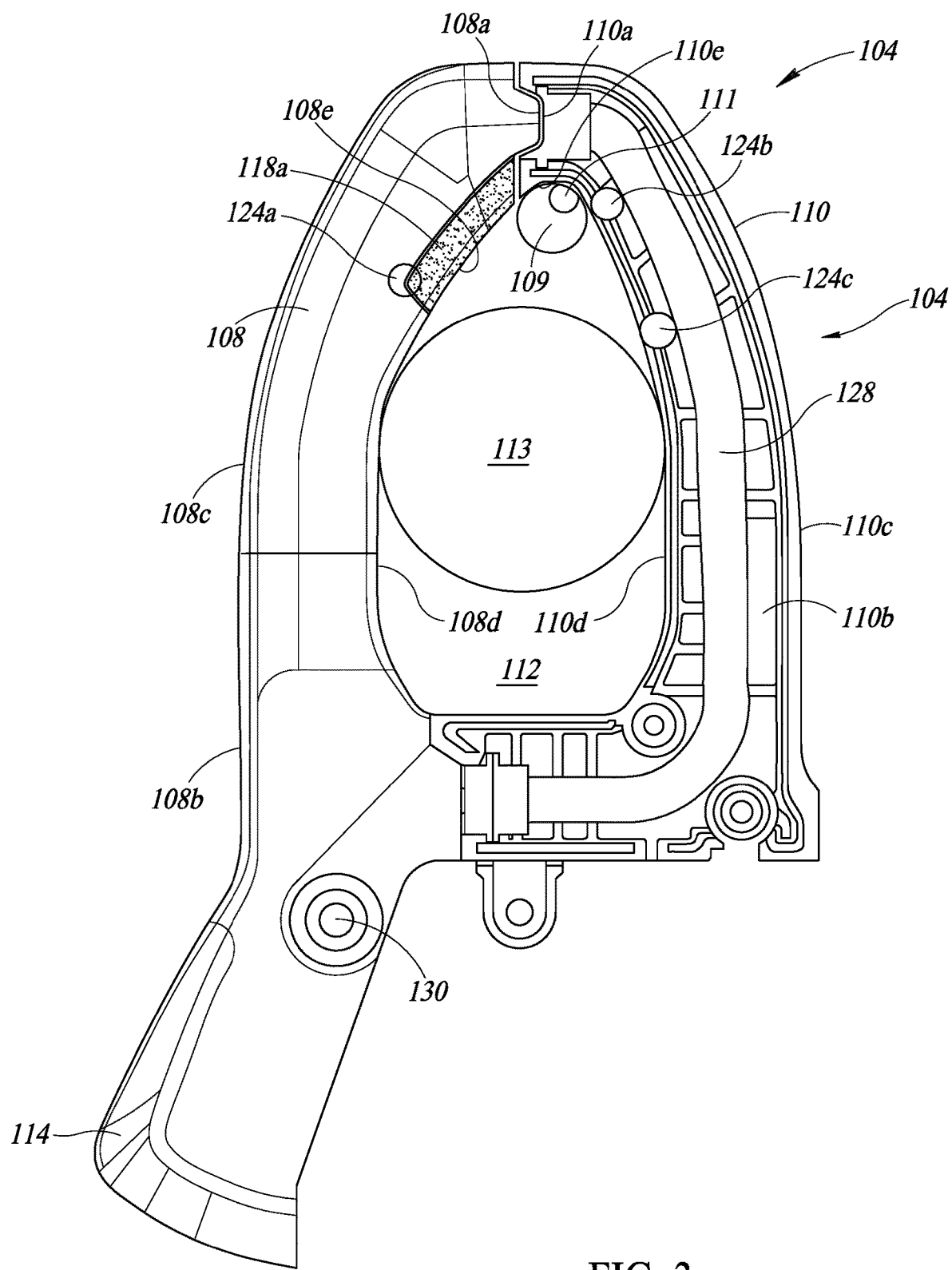
FIG. 3 is an enlarged view of the clamp jaw assembly of the electrical parameter measurement device of FIG. 1, according to one non-limiting illustrated implementation.

FIGS. 1-3 show an electrical parameter measurement device 100 according to an embodiment of the present disclosure. FIG. 1 is an exterior structure of the electrical parameter measurement device 100 when in a closed position, FIG. 2 shows the electrical parameter measurement device when in an open position, and FIG. 3 shows a jaw assembly portion of the electrical parameter measurement device with a portion of one of the jaws cut away to show the interior of the jaw assembly. In certain embodiments, the electrical parameter measurement device 100 can be used to measure voltage, current, power, or other electrical parameters in an electric conductor 109.

As shown in FIG. 1, the electrical parameter measurement device 100 includes a body 102 and a clamp jaw assembly 104. The clamp jaw assembly 104 is mounted to the body 102 and extends from the body 102. The body 102 has a body housing 106 that may be made of a lightweight material such as plastic, and the body housing 106 is adapted to enclose typical electrical and mechanical components of the electrical parameter measurement device 100, such as measurement and control circuitry 120. The body housing 106 may include a distal end 106a near the clamp jaw assembly 104 and an opposite proximal end 106b.

The body 102 may include an input user interface 122, which may include a control dial 122a, a display 122b, control buttons 122c, or other user interface elements. The display 122b may be a display of any suitable type, such as a liquid crystal display (LCD), a light-emitting diode (LED) display, an organic LED display, a plasma display, or an e-ink display. The body 102 may include one or more audio or haptic outputs (not shown), such as one or more speakers, buzzers, vibration devices, etc. In the illustrated implementation, the input user interface 122 comprises a plurality of buttons and a dial, but in other implementations the user interface may additionally or alternatively include one or more other types of input devices, such as a touch pad, touch screen, wheel, knob, microphone, etc.

The body 102 may also include a power supply, such as a battery or battery pack, for supplying power to the various components of the electrical parameter measurement device 100. The body 102 also includes the control circuitry 120 that controls the various operations of the electrical parameter measurement device 100, such as receiving signals from sensors, determining one or more electrical parameters of the insulated conductor 109 under measurement, and outputting measurement data (e.g., to the display 122b or to an external system). The control circuitry 120 may include one or more processors (e.g., microcontroller, DSP, ASIC, FPGA), one or more types of memory (e.g., ROM, RAM, flash memory, other nontransitory storage media), and/or one or more other types of processing or control related components.

In at least some implementations, the body 102 may include a wireless communications subsystem, which may include one or more of a Bluetooth® module, a Wi-Fi® module, a ZIGBEE® module, a near field communication (NFC) module, etc. The body 102 may be operative to communicate wirelessly via the wireless communications subsystem with an external receiving system, such as a computer, smart phone, tablet, personal digital assistant, etc., so as to transmit measurement results to the external system or to receive instruction signals or input information from an external system. The body 102 may additionally or alternatively include a wired communications subsystem, such as a USB interface, etc.

In at least some implementations, a plurality of different types of jaw assemblies or sensor probes may be detachably coupleable to the body 102 of the electrical parameter measurement device 100. The plurality of jaw assemblies or sensor probes may differ in at least one of shape, structure, or function, for example, to provide various functionality for the electrical parameter measurement device 100.

In the illustrated implementation, the clamp jaw assembly 104 includes a first clamp jaw 108 and a second clamp jaw 110 having respective proximal ends 108b, 110b and distal ends 108a, 110a. The first clamp jaw 108 includes an outward facing surface 108c and an inward facing surface 108d. Similarly, the second clamp jaw 110 includes an outward facing surface 110c and an inward facing surface 110d. The first clamp jaw 108 is pivotally mounted to the body 102, and the second clamp jaw 110 is fixedly mounted to the body 102. The first clamp jaw 108 is rotatable in relation to the second clamp jaw 110. In certain other embodiments, the first clamp jaw 108 may be slidably mounted to the body 102 such that it can slide in relation to the second clamp jaw 110. More generally, the first clamp jaw 108 and the second clamp jaw 110 are movable in relation to each other, which enables them to switch between a closed position shown in FIG. 1 and an open position shown in FIG. 2.

In the closed position shown in FIG. 1, the distal end 108a of the first clamp jaw 108 and the distal end 110a of the second clamp jaw 110 meet, such as to be in contact with or engage with each other, to define an enclosed measurement area 112 between the first clamp jaw 108, the second clamp jaw 110, and the distal end 106a of the body housing 106. The first clamp jaw 108 includes a sensor 124a in an inside space near its distal end 108a, and the second clamp jaw 110 includes sensors 124a and 124b in an inside space near its distal end. The sensors 124a, 124b, 124c, collectively "sensors 124," may be sensors that are operative to sense voltage, current, or both, in a conductor positioned in the measurement area 112 without making galvanic contact with the conductor. The sensors 124 are shown in dashed lines to indicate that they are disposed within an inside space or volume of the clamp jaws 108 and 110 and are not visible to the user.

In at least some implementations, the sensors 124 may be used to determine the precise location of the conductor under test, and/or to determine one or more calibration factors to apply to improve measurements of the electrical parameter measurement device 100. In the illustrated implementation, the sensors 124 may be relatively small (e.g., 3×3 mm), which provides a substantially radial variation of detected signals rather than a linear variation provided by the linear sensors. The sensors 124 may be strategically positioned at locations where the position of a conductor under test within the measurement area 112 may be most accurately determined.

The first clamp jaw 108 and the second clamp jaw 110 may additionally or alternatively have inductance coils in their inside space. As an illustration, FIG. 3 shows a portion of the clamp jaw assembly 104 wherein a portion of the second clamp jaw 110 is cut away to show an inductance coil 128 positioned within the inside space of the second clamp jaw. In such configurations, when the first clamp jaw 108 and the second clamp jaw 110 are in the closed position and a conductor under test passes through the enclosed measurement area 112 between the first clamp jaw 108 and the second clamp jaw 110, the inductance coils (e.g., inductance coil 128) can sense a change in the current flow in the conductor under test to generate a sensing current indicative of the amplitude of the current flow being tested. In some cases, in the closed position, the distal end 108a of the first clamp jaw 108 and the distal end 110a of the second clamp jaw 110 meet to form a gap therebetween (i.e., an air gap) sized less than or equal to a predetermined length. Under these circumstances, the inductance coils inside the first clamp jaw 108 and the second clamp jaw 110 can still sense the current flow in the conductor under test and generate the sensing current at a required ratio. Moreover, in the open position shown in FIG. 2, the distal end 108a of the first clamp jaw 108 and the distal end 110a of the second clamp jaw 110 are separate from each other, defining an opening therebetween. The opening is configured to at least allow the conductor 109 under test to pass through, such that the conductor under test can move to a position between the first clamp jaw 108 and the second clamp jaw 110 for measurement.

In at least some implementations, the body 102 may include a port 126 located at the proximal end 106b of the body housing 106 that is operative to receive one or more types of peripheral components, such as a flexible current probe, test probes, etc.

The sensors 124 and the inductance coil 128 may include various types of sensors, such as a non-contact voltage sensor, a Hall Effect element, a current transformer, a fluxgate sensor, a Rogowski coil, an anisotropic magnetoresistance (AMR) sensor, a giant magnetoresistance (GMR) sensor, other types of sensors operative to sense an electrical parameter of the conductor 109 without requiring galvanic contact, or any combination thereof. Various non-limiting examples of non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The first clamp jaw 108 has a proximal end 108b opposite the distal end 108a, which can move, such as rotate, in relation to the body 102. The proximal end 108b has the inner side positioned within the body 102, and an outer side away from the body 102. In the embodiment shown, the inner side of the proximal end 108b is substantially received within the body 102 while the outer side of the proximal end 108b is positioned out of the body 102 and is operable by an operator. An actuating or trigger 114 is generally positioned at the outward facing surface 108c of the proximal end 108b of the first clamp jaw 108.

Specifically, in the illustrated implementation a lateral side of the body housing 106 has a housing opening (not shown) allowing the proximal end 108b of the first clamp jaw 108 to pass through. The operator may operate the first clamp jaw 108, such as pressing the trigger 114 towards the body 102, which causes a portion or the entirety of the proximal end 108b to pass through the housing opening into the body 102, leaving the first and second clamp jaws 108 and 110 in the open position shown in FIG. 2.

By releasing the force applied to the trigger 114, the operator may cause the distal end 108a of the first clamp jaw 108 to rotate back toward the distal end 110a of the second clamp jaw 110 about a pivot point 130 (FIG. 3), such that the distal end 108a of the first clamp jaw is close to (e.g., adjacent) the distal end 110a of the second clamp jaw 110, and a portion or all of the proximal end 108b of the first clamp jaw 108 is moved out of the body 102 through the housing opening. In this way, the first clamp jaw 108 and the second clamp jaw 110 can be moved to the closed position. In certain embodiments, the first clamp jaw 108 can be biased to the closed position by a biasing subsystem 116, which may comprise a spring or one or more other components that are operative to bias one or both of the first and second clamp jaws 108 and 110 toward the closed position. In at least some implementations, the electrical parameter measurement device 100 may include a lock subsystem that is operative to lock the first and second clamp jaws in at least one of the closed position or the open position.

Advantageously, in at least some implementations one or both of the jaws of the jaw assembly may include a visual indicator proximate one or more of the sensors. In the illustrated example, the first clamp jaw 108 includes a visual indicator 118a proximate the distal end 108a near the sensor 124a, and the second clamp jaw 110 includes a visual indicator 118b proximate the distal end 110a near the sensors 124b and 124c. The visual indicators 118a and 118b, collectively "visual indicator 118," guides the user to place the insulated conductor 109 under test adjacent the visual indicator so that the conductor is also adjacent the sensors 124 in an optimum region within the measurement area 112, thereby improving measurement accuracy.

The visual indicator 118 may include a color-based indicator. For example, the visual indicator 118 may be a first color, and the first and second clamp jaws 108 and 110 may be second color different than the first color. As a non-limiting example, the first and second clamp jaws 108 may be red and the visual indicator 118 may be orange. In other implementations, the visual indicator 118 may be a text-based indicator (e.g., "position wire here"), a graphic-based indicator (e.g., arrow, picture), a physical shape indicator (e.g., a notch, a raised arrow, a bump), combinations thereof, or any other type of indicator that provides a guide (e.g., visual guide) to the user on where to position the conductor 109 under test to obtain the most accurate measurement results.

Further, in at least some implementations, the clamp jaw assembly 104 may be shaped and dimensioned to automatically direct the conductor 109 under test into a region of the measurement area 112 that provides the highest accuracy. In this example, the optimal region within the measurement area may be near the sensors 124. Since the measurement area 112 may be significantly larger than the diameter of smaller conductors under test, it is desirable to guide the user on where to position the conductor 109 within the measurement area 112 to ensure the best measurement results. FIG. 3 shows examples of a medium size conductor 109, a smaller conductor 111 and a larger conductor 113 in the measurement area 112. In particular, in the illustrated example, for a vertical conductor, the clamp jaw assembly 104 may have a skewed shape "U" or "V" shape that allows the user to pull the electrical parameter measurement device 100 toward them when the conductor 109 is in the measurement area 112, and the clamp jaw assembly 104 automatically guides the conductor 109 to the optimum region of the measurement area 112 proximate the distal ends 108a and 110a where the conductor is near the sensors 124. For a horizontal conductor, the user may clamp the clamp jaw assembly 104 around the conductor, as discussed above, and the weight of the electrical parameter measurement device 100 may cause the electrical parameter measurement device to naturally "hang" on the conductor 109 by the jaw assembly 104. When the electrical parameter measurement device 100 hangs from the conductor 109, the conductor is automatically positioned near the sensors 124 in the optimum region of the measurement area 112 to obtain the most accurate measurements. This can be particularly advantageous if the user plans to operate the electrical parameter measurement device 100 as a "leave behind" electrical parameter measurement device, wherein the electrical parameter measurement device obtains measurements over an extended period of time (e.g., minutes, hours, weeks, years).

As shown, in this example, the distal end 110a of the second clamp jaw 110 has a hook shaped portion that receives the conductor 109 under test when the electrical parameter measurement device 100 is pulled toward the user or hangs from the conductor. The asymmetrical shape of the distal ends 108a and 110a allows the majority of the force applied by the conductor 109 when the electrical parameter measurement device hangs therefrom to be imparted on the hooked portion of the second clamp jaw 110. This may be advantageous relative to implementations wherein the distal ends 108a and 110a are symmetrical since, in such implementations, the conductor 109 would be positioned at the meeting point of the distal ends, which may cause the clamp jaws to separate from each other if sufficient force is applied by the conductor (e.g., if the user pulls the electrical parameter measurement device 100 toward them with significant force).

Figure 4:
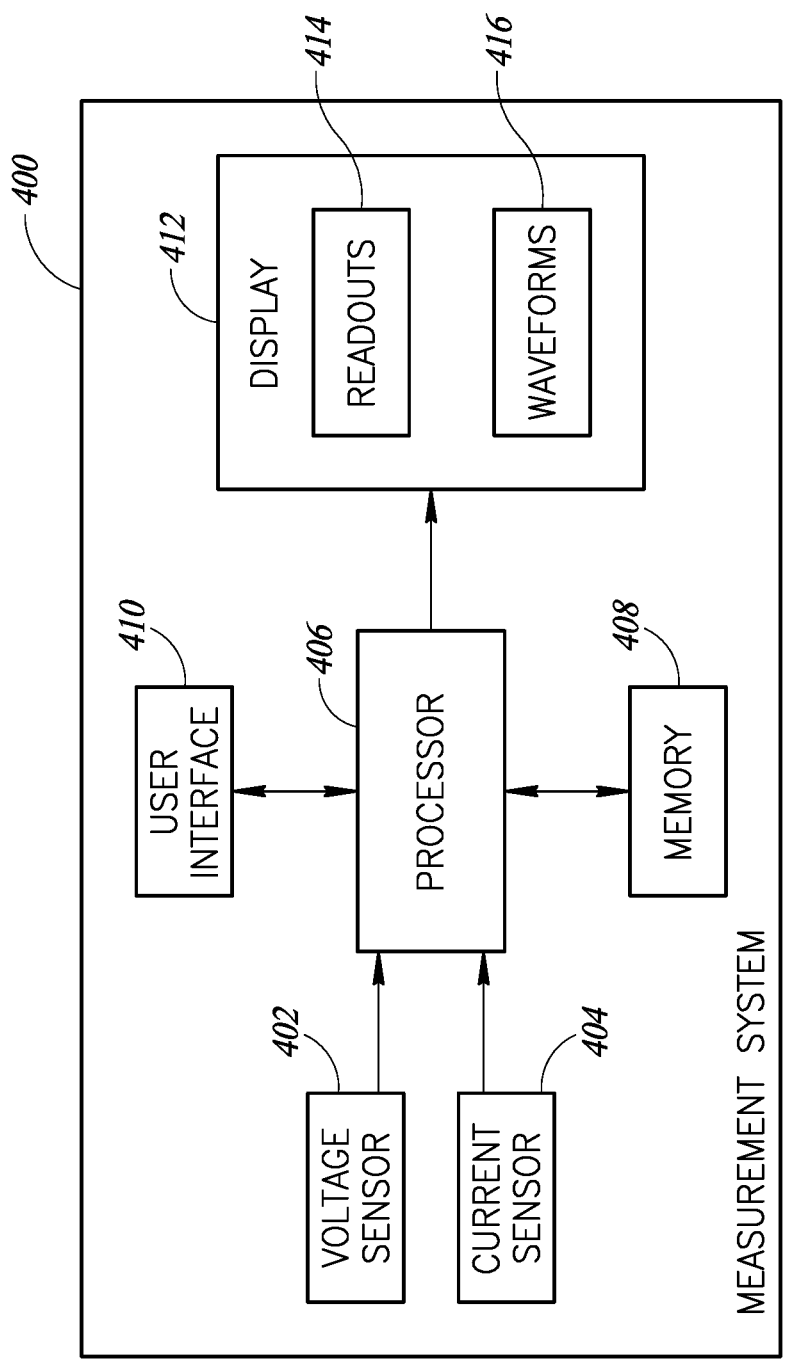
FIG. 4 is a schematic block diagram of an electrical parameter measurement device, according to one illustrated implementation.

FIG. 4 is a schematic block diagram of a non-contact measurement device 400 which provides non-contact voltage measurement functionality and non-contact current measurement functionality. The non-contact measurement device 400 may also determine one or more AC or DC electrical parameters (e.g., power, energy, frequency, harmonics) derived from voltage and/or current measurements. The non-contact measurement device 400 includes a voltage sensor 402 and a current sensor 404 that are each communicatively coupled to a processor 406. In some implementations, each of the voltage sensor 402 and the current sensor 404 may include a plurality of voltage sensors or current sensors, respectively. In some implementations, the non-contact measurement device 400 may include only voltage sensors or only current sensors.

The voltage sensor 402 and/or processor 406 may be similar or identical to any of the measurement devices discussed herein. The processor 406 may include one or more logic processing units, such as one or more central processing units (CPUs), microprocessors, digital signal processors (DSPs), application-specific integrated circuits (ASICs), field programmable gate arrays (FPGAs), etc. The non-contact measurement device 400 may also include memory 408 communicatively coupled to the processor 406 which stores at least one of instructions or data thereon. The memory 408 may include one or more solid state memories, for instance flash memory or solid state drive (SSD), which provide nonvolatile storage of computer-readable instructions, data structures, program modules and other data for the measurement device 400. Although not depicted, the non-contact measurement device 400 can employ other nontransitory computer- or processor-readable media, for example a hard disk drive, an optical disk drive, or memory card media drive.

The non-contact measurement device 400 may include a user interface 410 which may include any number of inputs (e.g., buttons, dials, switches, touch sensor, touchscreen) and any number of outputs (e.g., display, LEDs, speakers, buzzers). The non-contact measurement device 400 may also include one or more displays 412 which presents readouts 414 and/or waveforms 416.

In operation, the processor 406 receives signals from the voltage sensor 402 and the current sensor 404 to obtain voltage and current measurements, respectively. The processor 406 may utilize such voltage and current measurements to derive additional electrical parameters based on the combination of the measurements. Such parameters may include, for example, power (true power, apparent power, etc.), phase (e.g., three-phase), frequency, harmonics, energy, etc.

The voltage and current sensor signals may be obtained by the respective voltage and current sensors 402 and 404 during a common measurement time interval, which may be relatively short in duration (e.g., 10 milliseconds (ms), 100 ms, 1 second, 10 seconds). For example, the voltage sensor 402 and the current sensor 404 may obtain measurements at least partially concurrent with each other. As another example, one of the voltage sensor 402 and the current sensor 404 may obtain a measurement substantially immediately after the other of the voltage sensor and the current sensor obtains a measurement, such that the measurements are obtained at nearly the same time. In some implementations, the voltage sensor 402 and the current sensor 404 may be operative to repeatedly obtain measurements, concurrently or in succession, at specified intervals (e.g., every 10 ms, every 100 ms, every 1 second, every 10 seconds). Generally, the voltage sensor 402 and the current sensor 404 both obtain their respective measurements within a measurement time interval that is sufficiently short such that pairs of the voltage and current measurements correspond to each other, which allows for accurate derivation or determination of one or more electrical parameters (e.g., power, phase) using the obtained current and voltage measurements.

The processor 406 may provide readouts 414 of one or more of the measured or derived parameters, and may provide graphical representations of one or more characteristics. Such graphical representations may include waveforms, harmonic bar graphs, etc. Example signal characteristics which may be presented via the display 412 include voltage, current, frequency, power parameters (e.g., watts, KVA), phase, energy, harmonics, phase sequence detection, etc.

Figure 5:
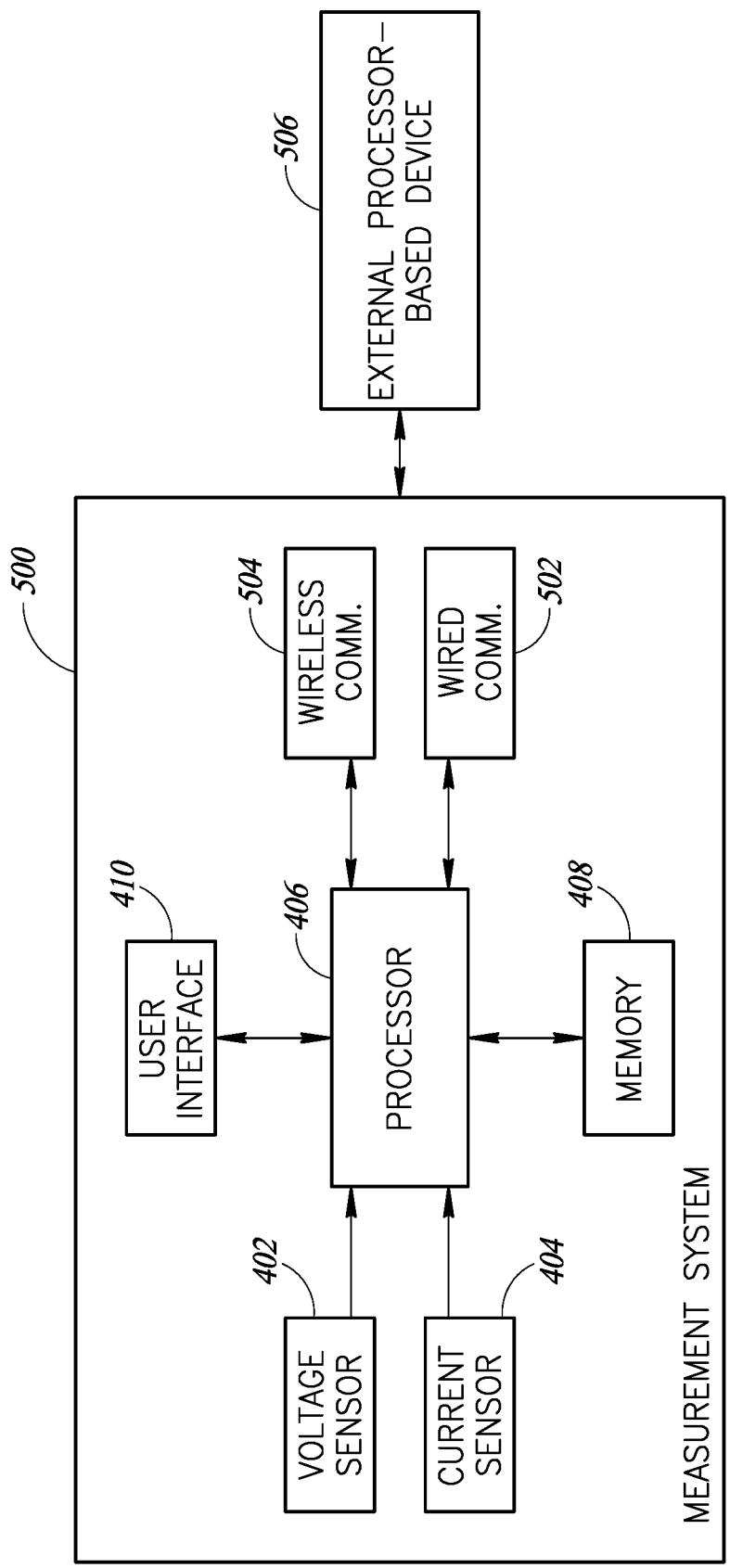
FIG. 5 is a schematic block diagram of an electrical parameter measurement device which operates as a remote sensor, according to one illustrated implementation.

FIG. 5 is a schematic block diagram of a measurement device 500 which provides non-contact voltage measurement functionality and/or non-contact current measurement functionality. The measurement device 500 is similar or identical to the measurement device 400 of FIG. 4 in many respects, so only relevant differences are discussed herein for the sake of brevity.

In this implementation, the measurement device 500 may not include a display and instead may be used as a "leave behind" sensor to monitor electrical equipment remotely via an external processor-based device 506. The external processor-based device 506 may include various types of devices, such as smartphones, tablet computers, laptop computers, wearable computers, servers, cloud computers, etc. The external processor-based device 506 may include a display to present data gathered by the measurement device 500 over a period of time (e.g., minutes, hours, days, weeks, years).

To communicate with one or more external processor-based devices, the measurement device 500 may include one or more wired communications interfaces 502 and/or one or more wireless communications interfaces 504.

Non-limiting examples of wireless communications interfaces 504 include Wi-Fi®, Bluetooth®, Bluetooth® Low Energy, Zigbee®, 6LoWPAN®, Optical IR, wireless HART, etc. Non-limiting examples of wired communications interfaces 502 include USB®, Ethernet, PLC, HART, MODBUS, FireWire®, Thunderbolt®, etc.

In addition to sending data to the external processor-based device 506, in at least some implementations the measurement device 500 may receive at least one of data or instructions (e.g., control instructions) from the external processor-based device 506 via the one or more wired communications interfaces 502 and/or the one or more wireless communications interfaces 504.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter measurement device, comprising:
   a body; and
   a clamp jaw assembly coupled to the body, the clamp jaw assembly comprising:
      a first clamp jaw comprising a proximal end coupled to the body and a distal end opposite the proximal end;
      a second clamp jaw comprising a proximal end coupled to the body and a distal end opposite the proximal end, the first clamp jaw and the second clamp jaw being movable in relation to each other between a closed position and an open position wherein, in the closed position, the respective distal ends of the first and second clamp jaws meet to define a measurement area that is enclosed between the first and second clamp jaws, and in the open position the respective distal ends of the first and second clamp jaws are separate from each other to define a gap that allows a conductor under test to pass therethrough into or out of the measurement area;
   at least one sensor positioned within an interior of the first clamp jaw or the second clamp jaw; and
   a visual indicator disposed proximate the at least one sensor on a surface of the first clamp jaw or the second clamp jaw, the visual indicator operative to guide an operator of the electrical parameter measurement device to position the conductor under test proximate the visual indicator to provide electrical parameter measurements, wherein the visual indicator comprises a first color of a first portion of the surface of the first clamp jaw or the second clamp jaw that is different than a second color of a second portion of the first clamp jaw or the second clamp jaw that surrounds the visual indicator.

2. The electrical parameter measurement device of claim 1 wherein the first clamp jaw is pivotally mounted to the body for pivoting movement relative to the second clamp jaw which is fixedly mounted to the body.

3. The electrical parameter measurement device of claim 1 wherein the first color is orange.

4. The electrical parameter measurement device of claim 3 wherein the second color is red.

5. The electrical parameter measurement device of claim 1 wherein the visual indicator comprises one or more of text-based indicator, a graphic-based indicator, or a physical shape indicator.

6. The electrical parameter measurement device of claim 1 wherein the at least one sensor comprise at least one voltage sensor or at least one current sensor.

7. The electrical parameter measurement device of claim 1 wherein the at least one sensor comprises a plurality of voltage sensors, at least one voltage sensor of the plurality of voltage sensors positioned inside the first clamp jaw proximate the distal end thereof, and at least one voltage sensor of the plurality of voltage sensors positioned inside the second clamp jaw proximate the distal end thereof.

8. The electrical parameter measurement device of claim 7 wherein the visual indicator is disposed on the respective surfaces of each of the distal ends of the first and second clamp jaws proximate the plurality of voltage sensors.

9. The electrical parameter measurement device of claim 1 wherein the distal end of one of the first clamp jaw and the second clamp jaw has a hook shaped portion that receives the conductor under test when the electrical parameter measurement device hangs from the conductor.

10. The electrical parameter measurement device of claim 1, further comprising an actuator operatively coupled to at least one of the first clamp jaw and the second clamp jaw, in operation, responsive to actuation by a user the actuator moves the clamp jaw assembly from the closed position to the open position.

11. The electrical parameter measurement device of claim 10 wherein the actuator biases the clamp jaw assembly in the closed position.

12. The electrical parameter measurement device of claim 1 wherein the at least one sensor comprises at least one of a non-contact voltage sensor, a Hall Effect sensor, a fluxgate sensor, a Rogowski coil, an anisotropic magnetoresistance (AMR) sensor, or a giant magnetoresistance (GMR) sensor.

13. The electrical parameter measurement device of claim 1, further comprising control circuitry communicatively coupled to the at least one sensor, in operation, the control circuitry:
   receives sensor data indicative of signals detected by the at least one sensor; and
   processes the sensor data to determine at least one electrical parameter of the conductor under test.

14. The electrical parameter measurement device of claim 13, further comprising:
   a wireless communications subsystem operatively coupled to the control circuitry, in operation, the wireless communications subsystem wirelessly transmits the at least one electrical parameter to an external system.

15. The electrical parameter measurement device of claim 13, further comprising:
   a display that, in operation, visually presents the determined at least one electrical parameter to a user of the electrical parameter measurement device.

16. A clamp jaw assembly for measuring an electrical parameter in an insulated conductor, the clamp jaw assembly comprising:
   a first clamp jaw comprising a proximal end and a distal end opposite the proximal end;
   a second clamp jaw comprising a proximal end and a distal end opposite the proximal end, the first clamp jaw and the second clamp jaw being movable in relation to each other between a closed position and an open position wherein, in the closed position, the respective distal ends of the first and second clamp jaws meet to define a measurement area that is enclosed between the first and second clamp jaws, and in the open position the respective distal ends of the first and second clamp jaws are separate from each other to define a gap that allows a conductor under test to pass therethrough into or out of the measurement area;

at least one sensor positioned within an interior of the first clamp jaw or the second clamp jaw; and a visual indicator disposed proximate the at least one sensor on a surface of the first clamp jaw or the second clamp jaw, the visual indicator operative to guide an operator to position the conductor under test proximate the visual indicator to provide electrical parameter measurements, wherein the visual indicator comprises a first color of a first portion of the surface of the first clamp jaw or the second clamp jaw that is different than a second color of a second portion of the first clamp jaw or the second clamp jaw that surrounds the visual indicator.

17. The clamp jaw assembly of claim 16 wherein the first color is orange and the second color is red.

18. The clamp jaw assembly of claim 16 wherein the visual indicator comprises one or more of text-based indicator, a graphic-based indicator, or a physical shape indicator.

19. The clamp jaw assembly of claim 16 wherein the at least one sensor comprises at least one voltage sensor or at least one current sensor.

20. A device for measuring an electrical parameter in an insulated conductor, the device comprising:

a body;

a clamp jaw assembly coupled to the body, the clamp jaw assembly comprising:
  a first clamp jaw comprising a proximal end coupled to the body and a distal end opposite the proximal end;
  a second clamp jaw comprising a proximal end coupled to the body and a distal end opposite the proximal end, the first clamp jaw and the second clamp jaw being movable in relation to each other between a closed position and an open position wherein, in the closed position, the respective distal ends of the first and second clamp jaws meet to define a measurement area that is enclosed between the first and second clamp jaws, and in the open position the respective distal ends of the first and second clamp jaws are separate from each other to define a gap that allows a conductor under test to pass therethrough into or out of the measurement area;
  a first sensor positioned within an interior of the first clamp jaw proximate the distal end of the first clamp jaw;
  a second sensor positioned within an interior of the second clamp jaw proximate the distal end of the second clamp jaw; and
  a visual indicator disposed proximate each of the first and second sensors, the visual indicator operative to guide an operator of the device to position the conductor under test proximate the visual indicator to provide electrical parameter measurements, wherein the visual indicator comprises a first color of a first portion of a surface of the first clamp jaw or the second clamp jaw that is different than a second color of a second portion of the first clamp jaw or the second clamp jaw that surrounds the visual indicator;

a display; and control circuitry communicatively coupled to the first and second sensors and the display, in operation, the control circuitry:
  receives sensor data indicative of signals detected by the first and second sensors;
  processes the sensor data to determine at least one electrical parameter of the insulated conductor; and
  causes the display to present the at least one electrical parameter to a user.

* * * * *